US012740338B2

(12) United States Patent
Chang et al.

(10) Patent No.: US 12,740,338 B2
(45) Date of Patent: Sep. 15, 2026

(54) RESISTIVE RANDOM ACCESS MEMORY DEVICE AND FABRICATION METHOD THEREOF

(71) Applicant: UNITED MICROELECTRONICS CORP., Hsin-Chu City (TW)

(72) Inventors: Kai-Jiun Chang, Taoyuan City (TW); Yu-Huan Yeh, Taichung City (TW); Chuan-Fu Wang, Miaoli County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 417 days.

(21) Appl. No.: 18/380,212

(22) Filed: Oct. 16, 2023

(65) Prior Publication Data

US 2025/0098557 A1 Mar. 20, 2025

(30) Foreign Application Priority Data

Sep. 19, 2023 (TW) ................................ 112135686

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/00* (2023.02); *H10N 70/011* (2023.02); *H10N 70/24* (2023.02); *H10N 70/8833* (2023.02)

(58) Field of Classification Search
CPC .... H10N 70/841; H10N 70/011; H10N 70/24; H10N 70/8833; H10N 70/826; H10B 63/00; H10B 63/30
USPC .......................................................... 257/4
See application file for complete search history.

(56) References Cited

U.S. PATENT DOCUMENTS

2013/0214236 A1* 8/2013 Lu ........................ H10N 70/826 257/4
2015/0162529 A1* 6/2015 Lee ...................... H10N 70/841 711/147
2015/0372227 A1 12/2015 Liu
2018/0375024 A1* 12/2018 Chu ....................... H10N 70/24
2022/0320429 A1 10/2022 Narayanan
2022/0320431 A1 10/2022 Narayanan

* cited by examiner

*Primary Examiner* — Tong-Ho Kim
(74) *Attorney, Agent, or Firm* — Winston Hsu

(57) ABSTRACT

A resistive random access memory device includes a substrate; a dielectric layer disposed on the substrate; a conductive via disposed in the dielectric layer; a metal nitride layer disposed on the conductive via, wherein the metal nitride has a gradient nitrogen concentration along a thickness direction of the metal nitride layer; a resistive switching layer disposed on the metal nitride layer; and a metal oxynitride layer disposed on the resistive switching layer, wherein the metal oxynitride layer has a gradient nitrogen concentration along a thickness direction of the metal oxynitride layer.

18 Claims, 4 Drawing Sheets

RESISTIVE RANDOM ACCESS MEMORY DEVICE AND FABRICATION METHOD THEREOF

BACKGROUND OF THE INVENTION

1. Field of the Invention

The present invention relates to the field of semiconductor technology, and in particular to an improved resistive random access memory (RRAM) device and a fabrication method thereof.

2. Description of the Prior Art

Resistive random access memory (RRAM) is a memory structure including an array of RRAM cells each of which stores a bit of data using resistance values, rather than electronic charge. Particularly, each RRAM cell includes a resistive-switching material layer, the resistance of which can be adjusted to represent logic "0" or logic "1."

In advanced technology nodes, the feature size scales down and the size of memory devices is reduced accordingly. However, the reduction of the RRAM devices is limited due to the "forming" operation. In the "forming" process, a high voltage is applied to the RRAM device to generate a conductive path in the resistive-switching material layer.

$HfO_x$-based RRAM devices face the problem of insufficient operating windows. When the bit line voltage is too high, it is easy to cause the out-diffusion of oxygen atoms, and when the source line voltage is too high, it will cause too many oxygen atoms to be trapped in the titanium metal layer below the $HfO_x$ resistive switching layer.

SUMMARY OF THE INVENTION

It is one object of the present invention to provide an improved resistive random access memory device and a fabrication method thereof to solve the deficiencies or shortcomings of the prior art.

One aspect of the invention provides a resistive random access memory device including a substrate; a dielectric layer disposed on the substrate; a conductive via disposed in the dielectric layer; a metal nitride layer disposed on the conductive via, wherein the metal nitride has a gradient nitrogen concentration along a thickness direction of the metal nitride layer; a resistive switching layer disposed on the metal nitride layer; and a metal oxynitride layer disposed on the resistive switching layer, wherein the metal oxynitride layer has a gradient nitrogen concentration along a thickness direction of the metal oxynitride layer.

According to some embodiments, the resistive switching layer comprises a $HfO_2$ layer.

According to some embodiments, the $HfO_2$ layer has a thickness of about 50 angstroms.

According to some embodiments, the metal oxynitride layer comprises $TiO_xN_y$ or $TaO_xN_y$, wherein x is between 0-1 and y is between 0-1.

According to some embodiments, the metal oxynitride layer comprises an oxygen-rich $TiO_xN_y$ layer adjacent to the resistive switching layer, wherein x is greater than 0.5 and y is smaller than 0.5.

According to some embodiments, the oxygen-rich $TiO_xN_y$ layer has a thickness ranging between 10-20 angstroms.

According to some embodiments, the metal oxynitride layer comprises a nitrogen-rich $TiO_xN_y$ layer, wherein x is smaller than 0.5 and y is greater than 0.5.

According to some embodiments, the nitrogen-rich $TiO_xN_y$ layer has a thickness ranging between 200-500 angstroms.

According to some embodiments, the conductive via is a tungsten via.

According to some embodiments, the conductive via is in direct contact with the metal nitride layer.

Another aspect of the invention provides a method for forming a resistive random access memory device. A substrate is provided. A dielectric layer is formed on the substrate. A conductive via is formed in the dielectric layer. A metal nitride layer is formed on the conductive via. The metal nitride has a gradient nitrogen concentration along a thickness direction of the metal nitride layer. A resistive switching layer is formed on the metal nitride layer. A metal oxynitride layer is formed on the resistive switching layer. The metal oxynitride layer has a gradient nitrogen concentration along a thickness direction of the metal oxynitride layer.

According to some embodiments, the resistive switching layer comprises a $HfO_2$ layer. According to some embodiments, the $HfO_2$ layer has a thickness of about 50 angstroms.

According to some embodiments, the metal oxynitride layer comprises $TiO_xN_y$ or $TaO_xN_y$, wherein x is between 0-1 and y is between 0-1.

According to some embodiments, the metal oxynitride layer comprises an oxygen-rich $TiO_xN_y$ layer adjacent to the resistive switching layer, wherein x is between greater than 0.5 and y is smaller than 0.5.

According to some embodiments, the oxygen-rich $TiO_xN_y$ layer has a thickness ranging between 10-20 angstroms.

According to some embodiments, the metal oxynitride layer comprises a nitrogen-rich $TiO_xN_y$ layer, wherein x is between smaller than 0.5 and y is greater than 0.5.

According to some embodiments, the nitrogen-rich $TiO_xN_y$ layer has a thickness ranging between 200-500 angstroms.

According to some embodiments, the conductive via is a tungsten via.

According to some embodiments, the conductive via is in direct contact with the metal nitride layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
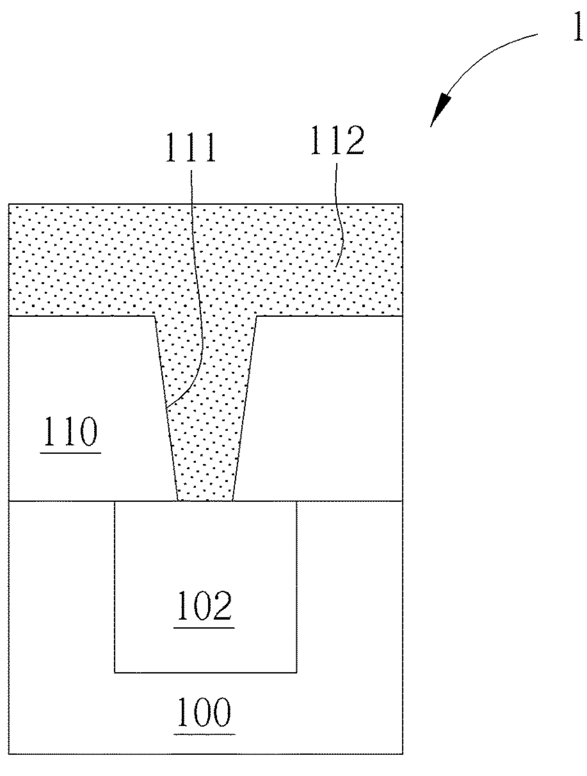
FIG. 1 to FIG. 6 are schematic diagrams showing an exemplary method of forming a resistive switching device according to an embodiment of the present invention.

Please refer to FIG. 1 to FIG. 6, which are schematic diagrams showing an exemplary method of forming a resistive switching device 1 according to an embodiment of the present invention. The resistive switching device 1 may be a resistive random access memory device. As shown in FIG. 1, a substrate 100, such as a silicon substrate, is provided. At least one conductive structure 102, including but not limited to a metal layer or a metal pad, is formed on the substrate 100. According to an embodiment of the present invention, for example, the conductive structure 102 may be a damascene copper structure. Those skilled in the art should understand that the substrate 100 may further include circuit elements, dielectric layers, interconnect structures, etc., which are not shown in the figure for the sake of simplicity.

A dielectric layer 110 is then formed on the substrate 100 to cover the conductive structure 102. According to an embodiment of the present invention, for example, the dielectric layer 110 may include a dielectric material such as silicon oxide. Lithography and etching processes are then performed to form a through via 111 in the dielectric layer 110 to expose part of the conductive structure 102. A metal layer 112, such as a tungsten metal layer, is deposited on the substrate 100 to fill the through via 111.

Figure 2:
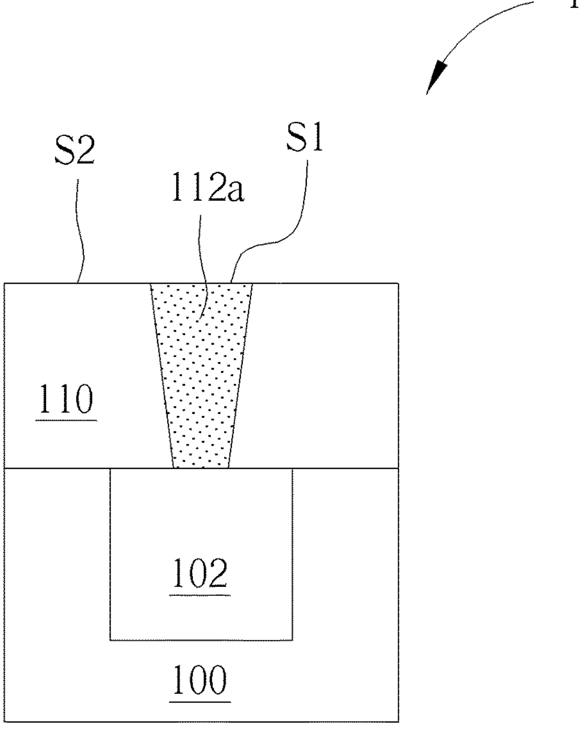

As shown in FIG. 2, a chemical mechanical polishing (CMP) process is then performed to remove the metal layer 112 outside the through via 111, leaving only the metal layer 112 inside the through via 111, thereby forming a conductive via 112*a*. According to an embodiment of the present invention, the conductive via 112*a* is a tungsten via. At this point, the top surface S1 of the conductive via 112*a* is coplanar with the top surface S2 of the first dielectric layer 110.

Figure 3:
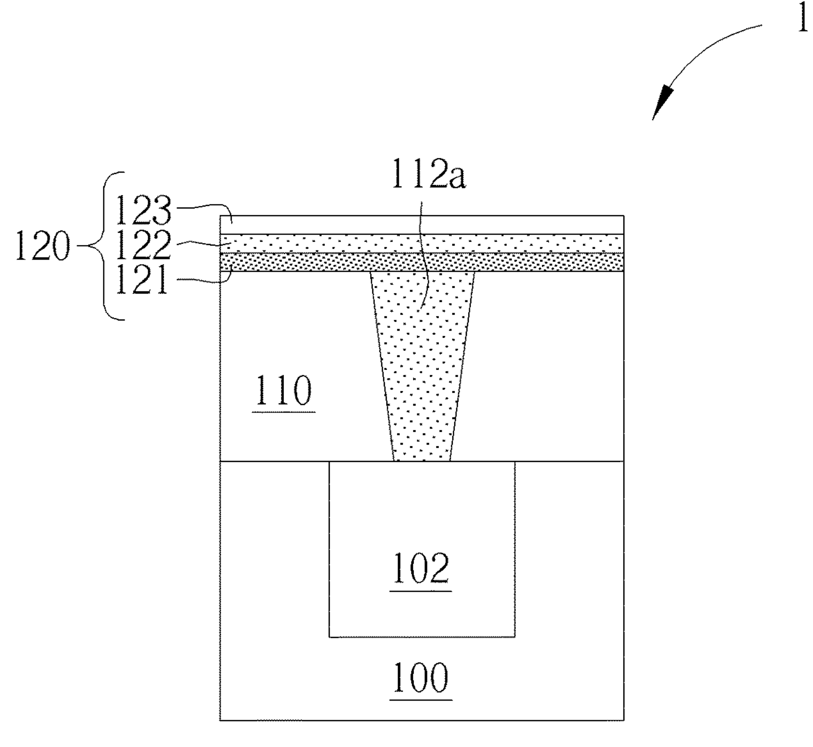

As shown in FIG. 3, a chemical vapor deposition (CVD) process, such as an atomic layer deposition (ALD) process, is performed to form a metal nitride layer 120 on the conductive via 112*a* and the dielectric layer 110. According to an embodiment of the present invention, the metal nitride layer 120 has a gradient nitrogen concentration in its thickness direction, and has a higher nitrogen concentration near the conductive via 112*a*.

According to an embodiment of the present invention, for example, the metal nitride layer 120 includes a bottom layer 121 in direct contact with the conductive via 112*a*, an intermediate layer 122 located on the bottom layer 121, and a top layer 123 located on the intermediate layer 122. The nitrogen concentration of the bottom layer 121 is higher than the nitrogen concentration of the intermediate layer 122. The nitrogen concentration of the intermediate layer 122 is higher than the nitrogen concentration of the top layer 123.

According to an embodiment of the present invention, for example, the metal nitride layer 120 includes titanium nitride. The bottom layer 121 may be a nitrogen-rich titanium nitride layer (e.g., Ti:N=1:1) deposited by performing multiple TiN ALD cycles. For example, the bottom layer 121 has a thickness ranging between 100-200 angstroms. The intermediate layer 122 may be a titanium nitride layer (e.g., Ti:N=1:0.5) deposited by performing multiple TiN ALD cycles and multiple Ti ALD cycles. The top layer 123 may be a titanium layer (e.g., Ti:N=1:0) deposited by performing multiple Ti ALD cycles. For example, the top layer 123 has a thickness that is less than 100 angstroms. According to an embodiment of the present invention, the bottom layer 121 of the metal nitride layer 120 is used as the bottom electrode of the resistive switching device 1, and the top layer 123 can be used as the oxygen storage layer of the resistive switching device 1.

Figure 4:
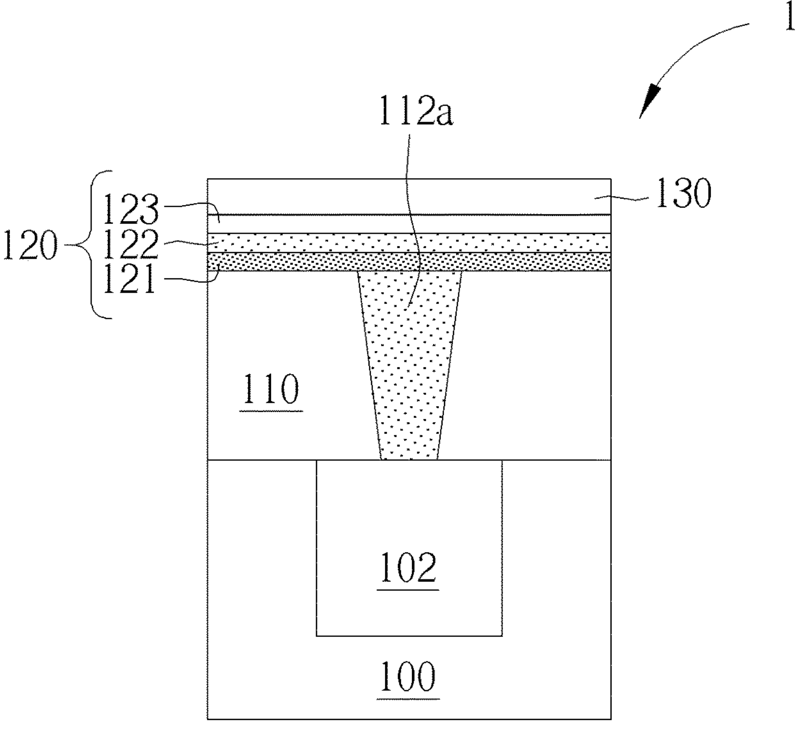

As shown in FIG. 4, a chemical vapor deposition process, such as an atomic layer deposition process, may be continued to form the resistive switching layer 130 on the metal nitride layer 120. According to an embodiment of the present invention, the resistive switching layer 130 may include a $HfO_2$ layer having a thickness of about 50 angstroms. According to other embodiments of the present invention, the resistive switching layer 130 may include transition metal oxides such as $TiO_2$ or $Ta_2O_5$.

Figure 5:
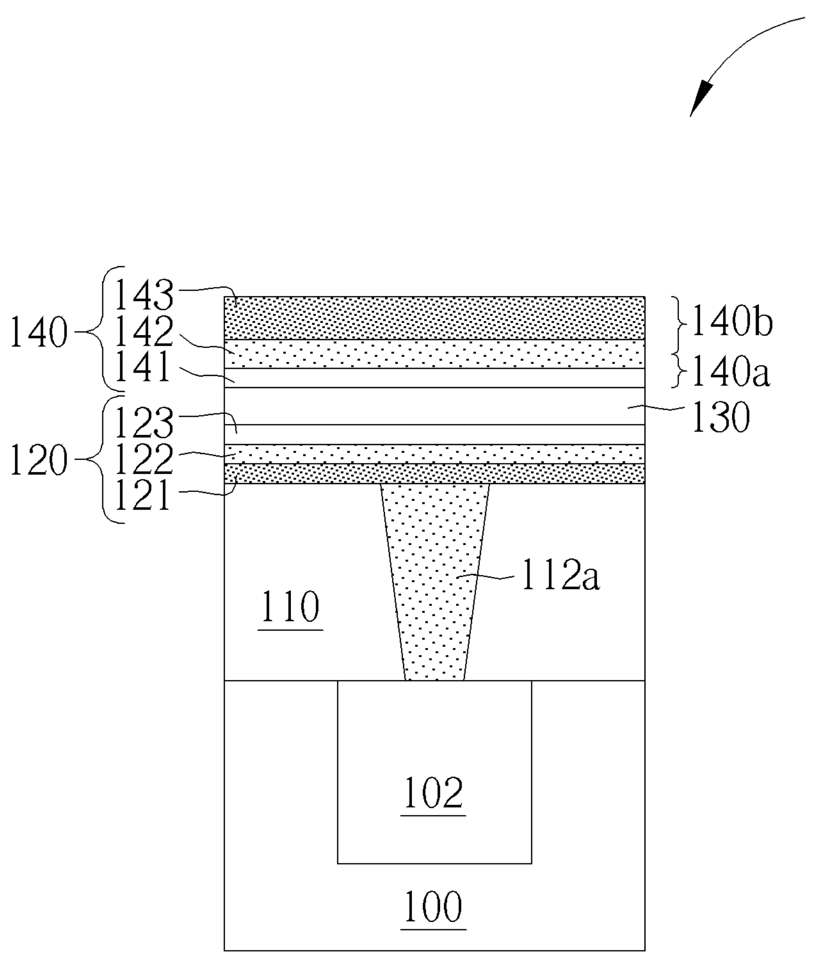

As shown in FIG. 5, a chemical vapor deposition process, such as an atomic layer deposition process, may be continued to form a metal oxynitride layer 140 on the resistive switching layer 130. The metal oxynitride layer 140 has a gradient nitrogen concentration in its thickness direction. According to an embodiment of the present invention, the metal oxynitride layer 140 includes $TiO_xN_y$ or $TaO_xN_y$, where x is between 0-1 and y is between 0-1.

According to an embodiment of the present invention, for example, the metal oxynitride layer 140 includes a bottom layer 141 in direct contact with the resistive switching layer 130, an intermediate layer 142 located on the bottom layer 141, and a top layer 143 located on the intermediate layer 142. The nitrogen concentration of the bottom layer 141 is lower than the nitrogen concentration of the intermediate layer 142, and the nitrogen concentration of the intermediate layer 142 is lower than the nitrogen concentration of the top layer 143.

According to an embodiment of the present invention, for example, the metal oxynitride layer 140 is $TiO_xN_y$, where x is between 0-1 and y is between 0-1. The bottom layer 141 may be an oxygen-rich titanium oxynitride layer (for example, Ti:O:N=1:1:0) deposited by performing multiple Ti ALD cycles and oxygen treatment steps. The intermediate layer 142 may be a $TiO_xN_y$ layer (e.g., Ti:O:N=1:0.5:0.5) deposited by multiple Ti ALD cycles, oxygen treatment steps, and multiple TiN ALD cycles. The top layer 143 may be titanium nitride layer (e.g., Ti:O:N=1:0:1) deposited by multiple TiN ALD cycles. According to an embodiment of the present invention, the top layer 143 of the metal oxynitride layer 140 is used as a top electrode of the resistive switching device 1, and the bottom layer 141 can be used as an oxygen barrier layer of the resistive switching device 1.

According to an embodiment of the present invention, the metal oxynitride layer 140 includes an oxygen-rich $TiO_xN_y$ layer 140*a* adjacent to the resistive switching layer 130, where x is greater than 0.5 and y is less than 0.5. According to an embodiment of the present invention, the oxygen-rich $TiO_xN_y$ layer 140*a* includes the bottom layer 141 and a portion of the intermediate layer 142, and the oxygen-rich $TiO_xN_y$ layer 140*a* has a thickness of, for example, 10-20 angstroms. According to an embodiment of the present invention, the metal oxynitride layer 140 includes a nitrogen-rich $TiO_xN_y$ layer 140*b*, where x is less than 0.5 and y is greater than 0.5. According to an embodiment of the present invention, the thickness of the nitrogen-rich $TiO_xN_y$ layer 140*b* is, for example, 200-500 angstroms.

Figure 6:
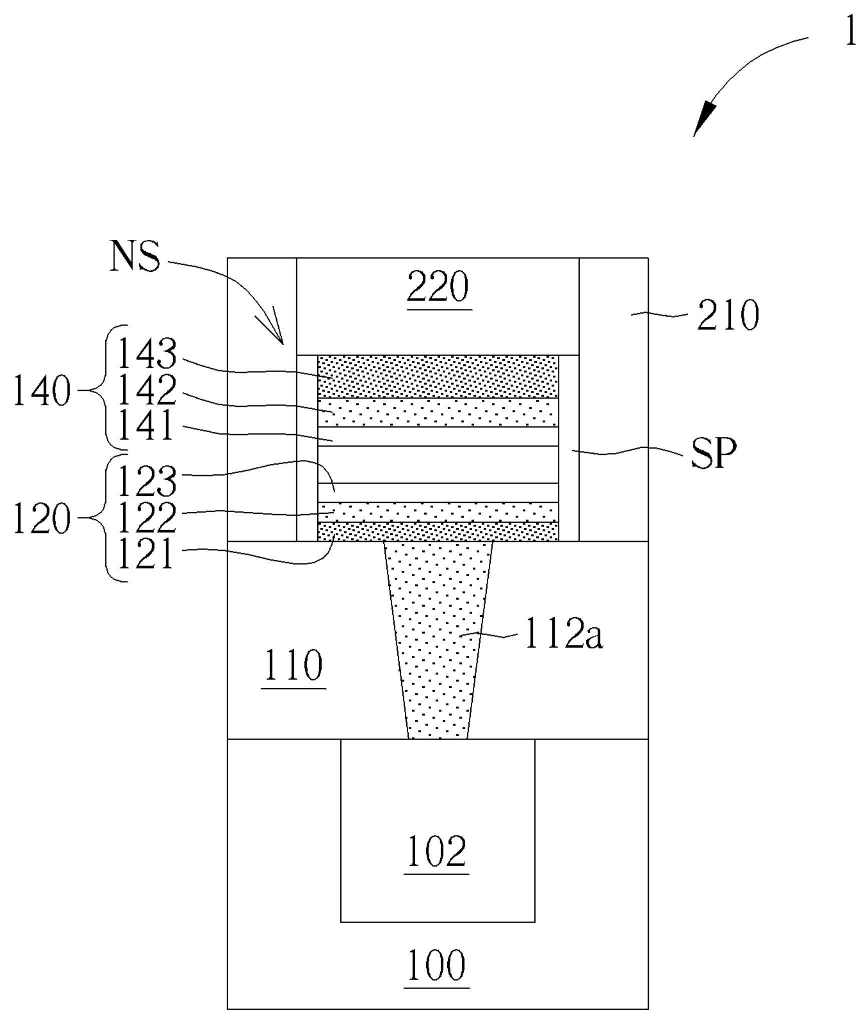

As shown in FIG. 6, a photolithography process and an etching process are then performed to pattern a film stack structure composed of the metal nitride layer 120, the resistive switching layer 130 and the metal oxynitride layer 140, thereby forming a storage structure NS on the conductive via 112*a*. A chemical vapor deposition process and an etch-back process may be performed to form sidewall spacers SP, for example, silicon nitride sidewall spacers, on the sidewalls of the storage structure NS. Next, a chemical vapor deposition process may be performed to deposit an inter-metal dielectric layer 210, such as a silicon oxide layer, on the storage structure NS and the sidewall spacers SP. A metallization process is then performed to form a conductive contact structure 220, such as a copper damascene structure, in the inter-metal dielectric layer 210 directly above the storage structure NS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory device, comprising:
- a substrate;
- a dielectric layer disposed on the substrate;
- a conductive via disposed in the dielectric layer;
- a metal nitride layer disposed on the conductive via, wherein the metal nitride has a gradient nitrogen concentration along a thickness direction of the metal nitride layer;
- a resistive switching layer disposed on the metal nitride layer; and
- a metal oxynitride layer disposed on the resistive switching layer, wherein the metal oxynitride layer has a gradient nitrogen concentration along a thickness direction of the metal oxynitride layer, wherein the metal oxynitride layer comprises an oxygen-rich $TiO_xN_y$ layer adjacent to the resistive switching layer, wherein x is greater than 0.5 and y is smaller than 0.5.

2. The resistive random access memory device according to claim 1, wherein the resistive switching layer comprises a $HfO_2$ layer.

3. The resistive random access memory device according to claim 2, wherein the $HfO_2$ layer has a thickness of about 50 angstroms.

4. The resistive random access memory device according to claim 1, wherein the metal oxynitride layer comprises $TiO_xN_y$ or $TaO_xN_y$, wherein x is between 0-1 and y is between 0-1.

5. The resistive random access memory device according to claim 1, wherein the oxygen-rich $TiO_xN_y$ layer has a thickness ranging between 10-20 angstroms.

6. The resistive random access memory device according to claim 1, wherein the conductive via is a tungsten via.

7. The resistive random access memory device according to claim 1, wherein the conductive via is in direct contact with the metal nitride layer.

8. A resistive random access memory device, comprising:
- a substrate;
- a dielectric layer disposed on the substrate;
- a conductive via disposed in the dielectric layer;
- a metal nitride layer disposed on the conductive via, wherein the metal nitride has a gradient nitrogen concentration along a thickness direction of the metal nitride layer;
- a resistive switching layer disposed on the metal nitride layer; and
- a metal oxynitride layer disposed on the resistive switching layer, wherein the metal oxynitride layer has a gradient nitrogen concentration along a thickness direction of the metal oxynitride layer, wherein the metal oxynitride layer comprises a nitrogen-rich $TiO_xN_y$ layer, wherein x is smaller than 0.5 and y is greater than 0.5.

9. The resistive random access memory device according to claim 8, wherein the nitrogen-rich $TiO_xN_y$ layer has a thickness ranging between 200-500 angstroms.

10. A method for forming a resistive random access memory device, comprising:
- providing a substrate;
- forming a dielectric layer on the substrate;
- forming a conductive via in the dielectric layer;
- forming a metal nitride layer on the conductive via, wherein the metal nitride has a gradient nitrogen concentration along a thickness direction of the metal nitride layer;
- forming a resistive switching layer on the metal nitride layer; and
- forming a metal oxynitride layer on the resistive switching layer, wherein the metal oxynitride layer has a gradient nitrogen concentration along a thickness direction of the metal oxynitride layer, wherein the metal oxynitride layer comprises an oxygen-rich $TiO_xN_y$ layer adjacent to the resistive switching layer, wherein x is greater than 0.5 and y is smaller than 0.5.

11. The method according to claim 10, wherein the resistive switching layer comprises a $HfO_2$ layer.

12. The method according to claim 11, wherein the $HfO_2$ layer has a thickness of about 50 angstroms.

13. The method according to claim 10, wherein the metal oxynitride layer comprises $TiO_xN_y$ or $TaO_xN_y$, wherein x is between 0-1 and y is between 0-1.

14. The method according to claim 10, wherein the oxygen-rich $TiO_xN_y$ layer has a thickness ranging between 10-20 angstroms.

15. The method according to claim 10, wherein the conductive via is a tungsten via.

16. The method according to claim 10, wherein the conductive via is in direct contact with the metal nitride layer.

17. A method for forming a resistive random access memory device, comprising:
- providing a substrate;
- forming a dielectric layer on the substrate;
- forming a conductive via in the dielectric layer;
- forming a metal nitride layer on the conductive via, wherein the metal nitride has a gradient nitrogen concentration along a thickness direction of the metal nitride layer;
- forming a resistive switching layer on the metal nitride layer; and
- forming a metal oxynitride layer on the resistive switching layer, wherein the metal oxynitride layer has a gradient nitrogen concentration along a thickness direction of the metal oxynitride layer, wherein the metal oxynitride layer comprises a nitrogen-rich $TiO_xN_y$ layer, wherein x is between smaller than 0.5 and y is greater than 0.5.

18. The method according to claim 17, wherein the nitrogen-rich $TiO_xN_y$ layer has a thickness ranging between 200-500 angstroms.

* * * * *